(12) United States Patent
Wickeraad et al.

(10) Patent No.: US 7,852,653 B2
(45) Date of Patent: Dec. 14, 2010

(54) CONTENT ADDRESSABLE MEMORY

(75) Inventors: John A. Wickeraad, Granite Bay, CA (US); Mark Gooch, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 637 days.

(21) Appl. No.: 11/810,124

(22) Filed: Jun. 4, 2007

(65) Prior Publication Data
US 2008/0298110 A1 Dec. 4, 2008

(51) Int. Cl.
*G11C 15/00* (2006.01)
(52) U.S. Cl. ............... 365/49.18; 365/49.1; 365/49.15; 365/49.16; 365/49.17; 711/108
(58) Field of Classification Search ............ 365/49.1, 365/49.11, 49.15, 49.16, 49.17, 49.18; 711/108
See application file for complete search history.

(56) References Cited

U.S. PATENT DOCUMENTS

| | | | |
|---|---|---|---|
| 6,693,814 B2 * | 2/2004 | McKenzie et al. | ....... 365/49.18 |
| 6,775,166 B2 | 8/2004 | McKenzie et al. | |
| 6,978,343 B1 * | 12/2005 | Ichiriu | ......... 711/108 |
| 6,999,331 B2 | 2/2006 | Huang | |
| 7,003,625 B2 * | 2/2006 | King | ......... 711/108 |
| 7,064,971 B2 | 6/2006 | Shau | |
| 7,136,961 B2 * | 11/2006 | Roth et al. | ........ 711/108 |
| 7,188,211 B2 | 3/2007 | Roth et al. | |
| 7,283,380 B1 * | 10/2007 | Srinivasan et al. | ...... 365/49.17 |

\* cited by examiner

*Primary Examiner*—Hoai V Ho
*Assistant Examiner*—Kretelia Graham (57) ABSTRACT

Systems, devices, and methods, including executable instructions are provided for content addressable memory (CAM). One method includes defining the CAM into an array of data words having M rows and N columns, with each of N and M being greater than one. The data words of the CAM are arranged according to a 2-dimensional priority scheme. Data words outside a selected 1×M column are masked to be ignored in determining a match, and the CAM is searched. Each search includes N compare cycles and each compare cycle having a different 1×M column selected. A highest priority match per compare cycle is pipelined from a priority encoder with the pipelined matches arranged to communicate a priority order in a first dimension of the 2-dimensional priority scheme.

17 Claims, 9 Drawing Sheets

CONTENT ADDRESSABLE MEMORY

BACKGROUND

Content addressable memory (CAM) is a useful device for executing table lookup operations. Particularly, because of the parallel lookup capability, a user can execute thousands or even millions of comparisons with one lookup operation.

For computer systems, CAM is widely used as the address lookup table for cache memory (called cache TAG), or as the paging translation look-aside table (TLB). For communication applications, CAM is widely used to support address lookup operations for routers. Recently, the rapid growth of networking systems has triggered strong demands for high density and high speed CAM devices. For networking applications, ternary content addressable memory (TCAM) is used to store various items such as quality of service (QoS) information, filter information, access control lists (ACL), etc. A current TCAM for networking application has 256K of 72 bit entries supporting 125 million lookups per second (LPS).

However, due to the parallel lookup operation, TCAM devices require support logic, e.g., priority encoders, on their match outputs for determining the TCAM-line address of the stored data that best matches the comparison data. In order to maximize computational speed, this support priority logic is also configured for parallel operation. One prior solution utilizes an M:1 priority encoder for an M-entry TCAM, as well as M match output flops. As the quantity of entries in a TCAM increases, complexity of the support priority encoder increases at a faster rate than the number of entries, i.e., approximately N×log N. Increased support priority encoder circuit complexity, increases design and manufacturing costs. In addition, significant circuit real estate is consumed by the support prioritizing logic, with physical size quickly becoming a limiting factor in continued expansion of current TCAM systems to support desired application performance.

DETAILED DESCRIPTION

Embodiments of the present disclosure include systems, methods, and computer readable media for content addressable memory (CAM) devices, and more particularly to portion searching methods for CAM integrated circuits (IC). As used herein a CAM can be either a binary CAM (BCAM) or a ternary CAM (TCAM). Some embodiments may include writing, to a TCAM, multiple entries per TCAM with multiple words per entry, the entries and constituent words of each entry arranged according to a pre-determined priority. Some embodiments include sequentially searching selected portions of TCAM entries, e.g., a subset of TCAM columns.

In one embodiment of the present invention, a method for using a CAM includes defining the CAM into an array of data words having M rows and N columns, with each of N and M being greater than one. The data words of the CAM are arranged according to a 2-dimensional priority scheme. Data words outside a selected 1×M column are masked to be ignored in determining a match, and the CAM is searched. Each search includes N compare cycles and each compare cycle having a different 1×M column selected. A highest priority match per compare cycle is pipelined from a priority encoder with the pipelined matches arranged to communicate a priority order in a first dimension of the 2-dimensional priority scheme.

As the reader will appreciate, various embodiments described herein can be performed by software, application modules, application specific integrated circuit (ASIC) logic, and/or executable instructions operable on the systems and devices shown herein or otherwise. "Software," as used herein, includes a series of executable instructions that can be stored in memory and executed by the hardware logic of a processor (e.g., transistor gates) to perform a particular task. Memory, as the reader will appreciate, can include random access memory (RAM), read only memory (ROM), non-volatile memory (such as Flash memory), etc.

An "application module" means a self-contained hardware or software component that interacts with a larger system. As the reader will appreciate a software module may come in the form of a file and handle a specific task within a larger software system. A hardware module may be a separate set of logic, e.g., transistor/circuitry gates, that "plug-in" as a card, appliance, or otherwise, to a larger system/device.

The embodiments of the present disclosure may be implemented in a stand-alone computing system or a distributed computing system. As such, FIGS. 1-8 are intended to provide a context for the description of the functions and operations of the present disclosure. Logic, suitable for carrying out embodiments of the present invention, can be resident in one or more devices or locations or in several devices and/or locations in a network.

Figure 1:
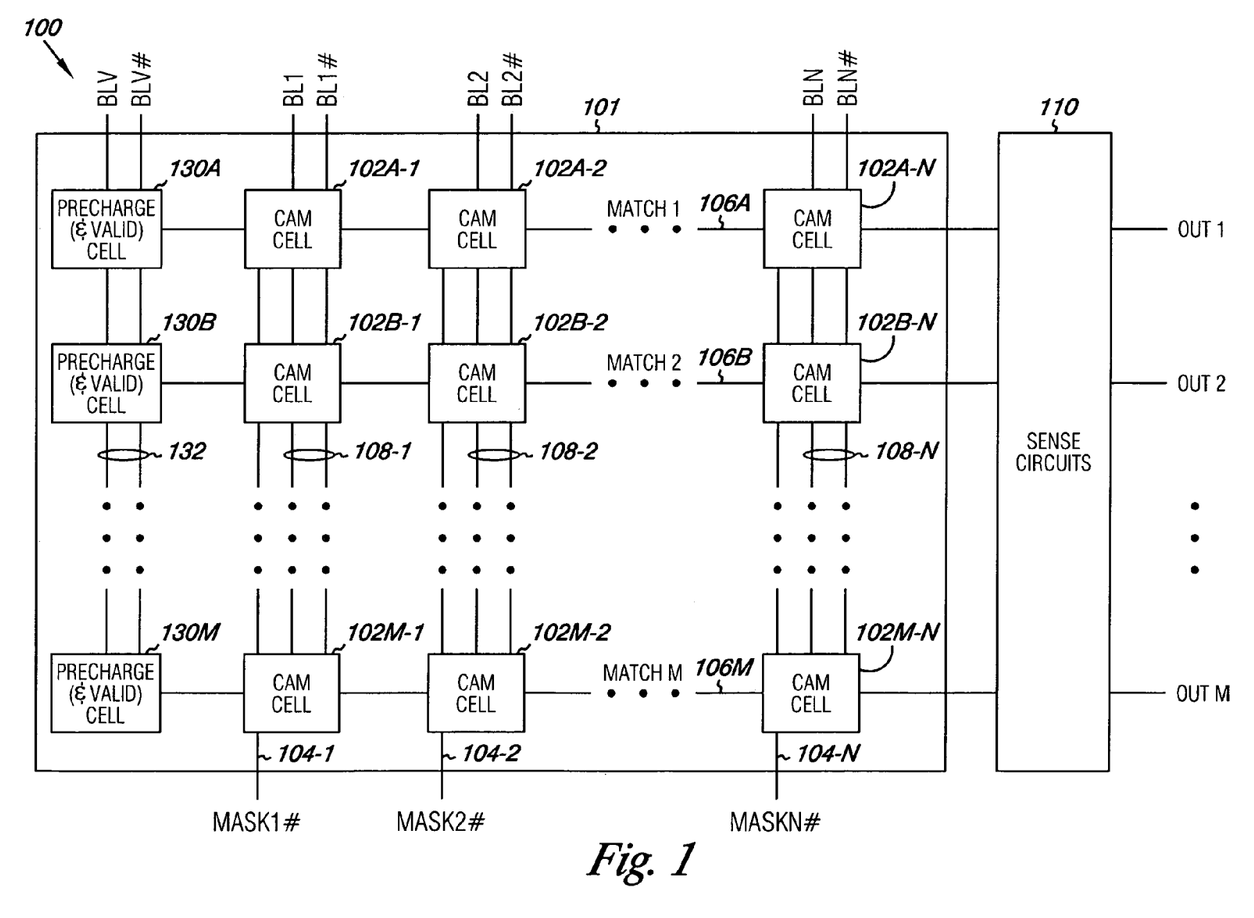
FIG. 1 illustrates an example of a content addressable memory (CAM) system in which embodiments of the present invention can be implemented.

FIG. 1 is a block diagram of a content addressable memory (CAM) system 100. CAM array 101 is a two-dimensional array of CAM cells, e.g., 102A-1, 102A-2, ..., 102M-N, physically or logically arranged into M rows by N columns. Each row of the CAM array includes N cells that collectively store data for an entry in the array. An entry, as used herein, is therefore synonymous with a row of the CAM. An entry may be defined to include one or more words of data, i.e., data words, per entry, i.e., row. For example, an entry may consist of one (1) N-bit word, two (2) N/2-bit words, etc. A word is simply a grouping of bit(s), typically functioning together to encode a piece of information. According to embodiments of the present invention, words are searchable portions of entries, for example, formed by physical or logical columns of cells within a CAM array.

Each row, i.e., entry, is also associated with a respective pre-charge/valid cell, e.g., 130A, 130B, . . . , 130M used to pre-charge, and optionally validate, a respective entry in the CAM array. Each CAM entry has its own word line (not shown in FIG. 1—see FIG. 2) for selecting individual entry for data write/read operations. Each row is further associated with a respective match line, e.g., 106-A, 106-B, . . . , 106-M (MATCH 1, MATCH 2, . . . , MATCH M, etc.), that couples to all CAM cells in the row and further couples to sense circuits 110. Each CAM entry has an output extension of the match line, e.g., shown in FIG. 1 to the right of the CAM cells forming column N, and indicating the results of comparison operations. The match output is used to select corresponding data row(s) in, for example, random access memory (RAM). FIG. 1 illustrates a CAM array 101 coupled to sense circuits 110 having output signal lines designated as OUT 1, OUT 2, . . . , OUT M. However, CAM array 101 could be directly connected to a memory array, such as a RAM, with each row of the RAM array storing data corresponding to each entry, i.e., row, of the CAM array 101. CAM array 101 could similarly be connected to some other type of memory element, or a match line encoder, e.g., a priority encoder, for giving an indication of whether a match occurred or not, determining the highest priority match, and indicating the address of the best match.

The CAM entries along the same column share the same set of bit line pairs, e.g., BL1-BL1#, BL2-BL2#, . . . BLN-BLN#, so that data comparisons can be executed on all the entries simultaneously. The naming convention of adding a "#" at the end of a label to indicate an active low signal is employed throughout the text and figures of this application. Each column of the CAM array is also associated with a mask control, e.g., MASK1#, MASK2#, . . . , MASKN#, that couples to all CAM cells in the column. Conventionally, each of the N columns of the CAM array is associated with a specific bit position of an N-bit input search data pattern, e.g., representing an address, port, etc. A differential data line pair, 108-1, 108-2, . . . , 108-N, e.g., BL1-BL1#, BL2-BL2#, BLN-BLN#, is provided for each compare data bit and couples to all cells in the corresponding column of the CAM array. In this way, each bit of the N-bit input search data pattern may be compared with each of the M bits stored in the M cells in the corresponding column. The N-bit input search data pattern may thus be provided to all M rows of the CAM array and simultaneously compared against all entries in the array. The differential data lines, 108-1, 108-2, . . . , 108-N, can also be used to write data into a given cell in the CAM array. Similarly, a differential validation line pair, 132, e.g., BLV-BLV#, is provided for each pre-charge/valid cell and couples to all such cells in the corresponding column of the CAM array.

Before performing the comparison between the input search data pattern, i.e., search term, and the entries in the CAM array, the M match lines (also referred to as "hit lines") for the M rows of the array are pre-charged to logic high, e.g., VDD. For each row, if any cell in the row is not matched to the corresponding address bit, then the output transistor for that cell is turned ON and the match line is pulled to logic low, e.g., VSS, or reference potential. Thus, for any given row, the match line remains at logic high, i.e., not pulled to VSS, only if the output transistors for all N cells in the row are turned OFF, which only occurs if each bit for the input search data pattern matches the bit in the corresponding cell of the row. The match line for each row is thus at logic high for a match between the entry in that row and the input search data pattern, and is at logic low if there is no match, i.e., a mismatch, between the entry and the input search data pattern.

When the data stored in each entry, i.e., row, is different from the data stored in all other entries, for each lookup operation involving the entire entry, only one or none of the entries can have a matched result for a binary CAM. The resulting match signal is detected by the sense circuits, and used to select one or none rows of data from a RAM array as the output for further operations.

According to one embodiment of the present invention, mask lines, e.g., 104-1, 104-2, . . . , 104-N, enable or disable a column's participation in a compare operation, for example, where the input search data pattern is a subset of the N-bit width of a entry, or the relevant portion of the input search data pattern is a subset of the entire input search data pattern. By masking certain columns of the array, to participate in or not participate in, a compare operation, the contents of the cells in the certain columns of the CAM array can be ignored in the compare operation. In this manner, a compare can be made to a portion of the columns comprising each entry, i.e., a columnar portion of each entry. Details of how mask lines, e.g., 104-1, 104-2, . . . , 104-N, function are further discussed below with respect to FIGS. 4A and 4B.

Figure 2:
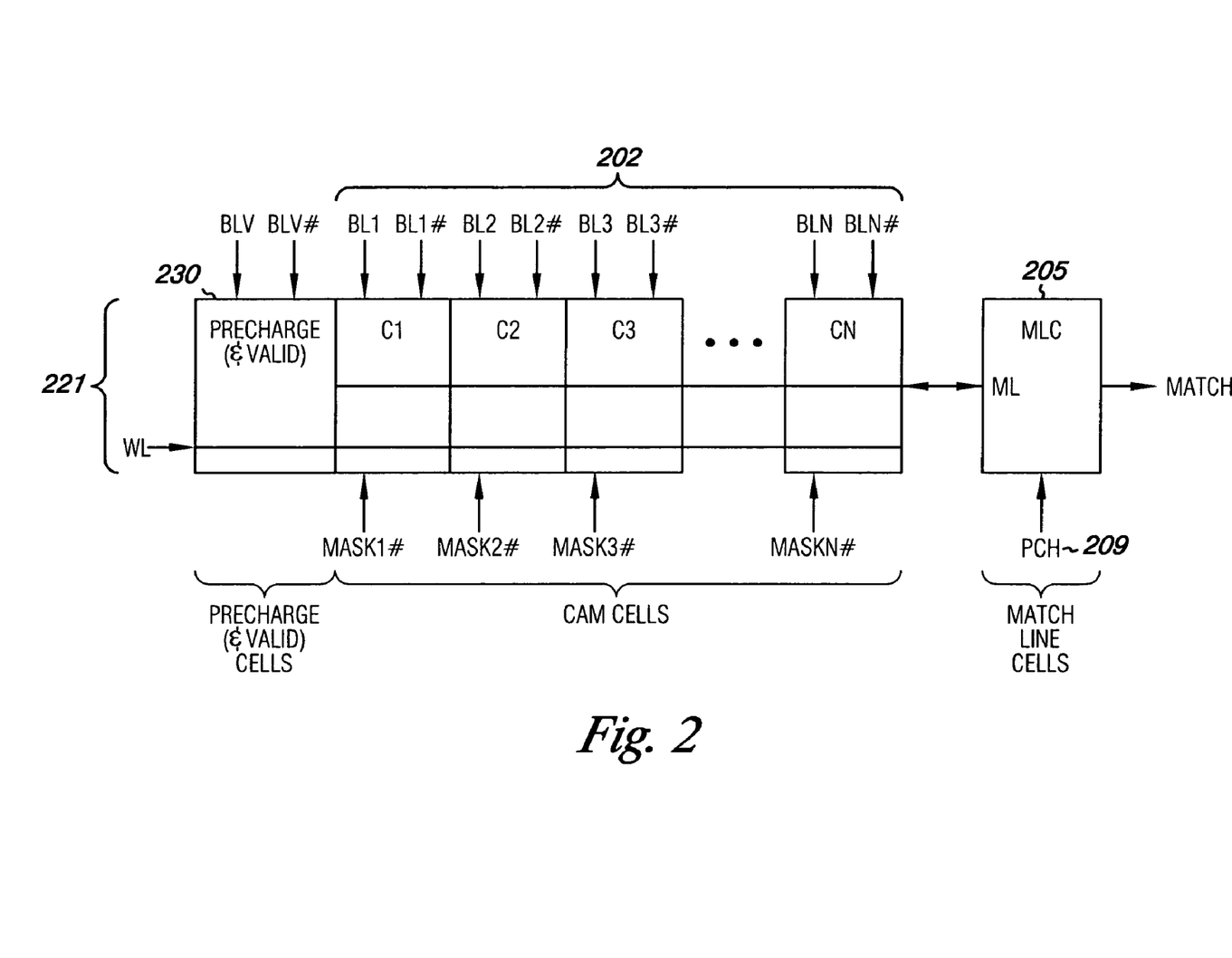
FIG. 2 illustrates a CAM entry, e.g., of a CAM system as shown in FIG. 1, in which embodiments of the present invention can be implemented.

FIG. 2 illustrates a CAM entry, e.g., of a CAM system as shown in FIG. 1. The CAM entry 221 in FIG. 2 includes a number of CAM cells, e.g., C1, C2, C3, . . . , CN, arranged in a row. Each cell, e.g., C1, C2, C3, . . . , CN, in an entry has its own bit line pair, BL1-BL1#, BL2-BL2#, BL3-BL3#, . . . BLN-BLN#, and its own mask line, MASK1#, MASK2#, MASK3#, . . . , MASKN#, while sharing the same word line (WL) and the same match line (ML) with other CAM cells in the same entry. A set of N-bit binary data can be written into or read from the storage nodes of these CAM cells by activating the word line WL in the same manner as a static random access memory (SRAM) operation. Simultaneous N-bit comparison can be executed by placing the N-bit comparison data into those N pairs of bit lines. If one or more than one bit of the N-bit inputs are different from the stored data, the match line (ML), which may be pre-charged to be active "high," is pulled "low," e.g., discharged, by the exclusive OR (XOR) structures in the CAM cells with mismatched data. If all bits in the CAM entry matches, the match line remains at a high impedance state because all the XOR structure in the CAM cells are at high impedance states.

Through the use of the mask lines, a portion, or portions, of each entry can be excluded from a compare operation. Simultaneous comparison can be executed by placing the N-bit comparison data into N pairs of bit lines, of which some subset of the N-bit data may be of interest. Before a comparison, the match line (ML) is pre-charged to be active "high" state. Generally, if one, or more than one, bit of the N-bit inputs are different from the stored data in the corresponding columns, the match line (ML) is pulled "low," e.g., discharged, by the exclusive OR (XOR) structures in the CAM cells with mismatched data. However, if a column is masked, it is prevented from discharging match lines (ML). Masked columnar portions are excluded from contributing to the discharge—only unmasked columns of CAM cells can participate in discharging match lines (ML). As the reader will appreciate, the portion of each entry that is masked cannot cause the match line (ML) to discharged, and are therefore in a "don't care" condition. If all bits in the unmasked portions of the CAM entry match, the match line remains at a high impedance state because all the XOR structure in the CAM cells are at high impedance states.

According to one example embodiment of the present invention, mask lines are active low and masked columns do not participate in discharging the match line (ML); however, the present invention is not so limited. For example, mask lines may be implemented active high and/or in such a manner that the "masked" columns are enabled to discharge match lines (ML) and the "unmasked" lines are prevented from contributing to discharging the match line (ML).

As shown in FIG. 2, the match line (ML) is connected to a match line logic circuit (MLC) 205. One example, of an approach to a MLC 205, having a pre-charge (PCH) input 209 and a MATCH output. Additional detail is provided in co-pending, co-assigned U.S. patent application Ser. No. 11/787,588, entitled, "Content Addressable Memory", filed on Apr. 17, 2007, having common inventorship. The same is incorporated herein in full by reference.

Figure 3:
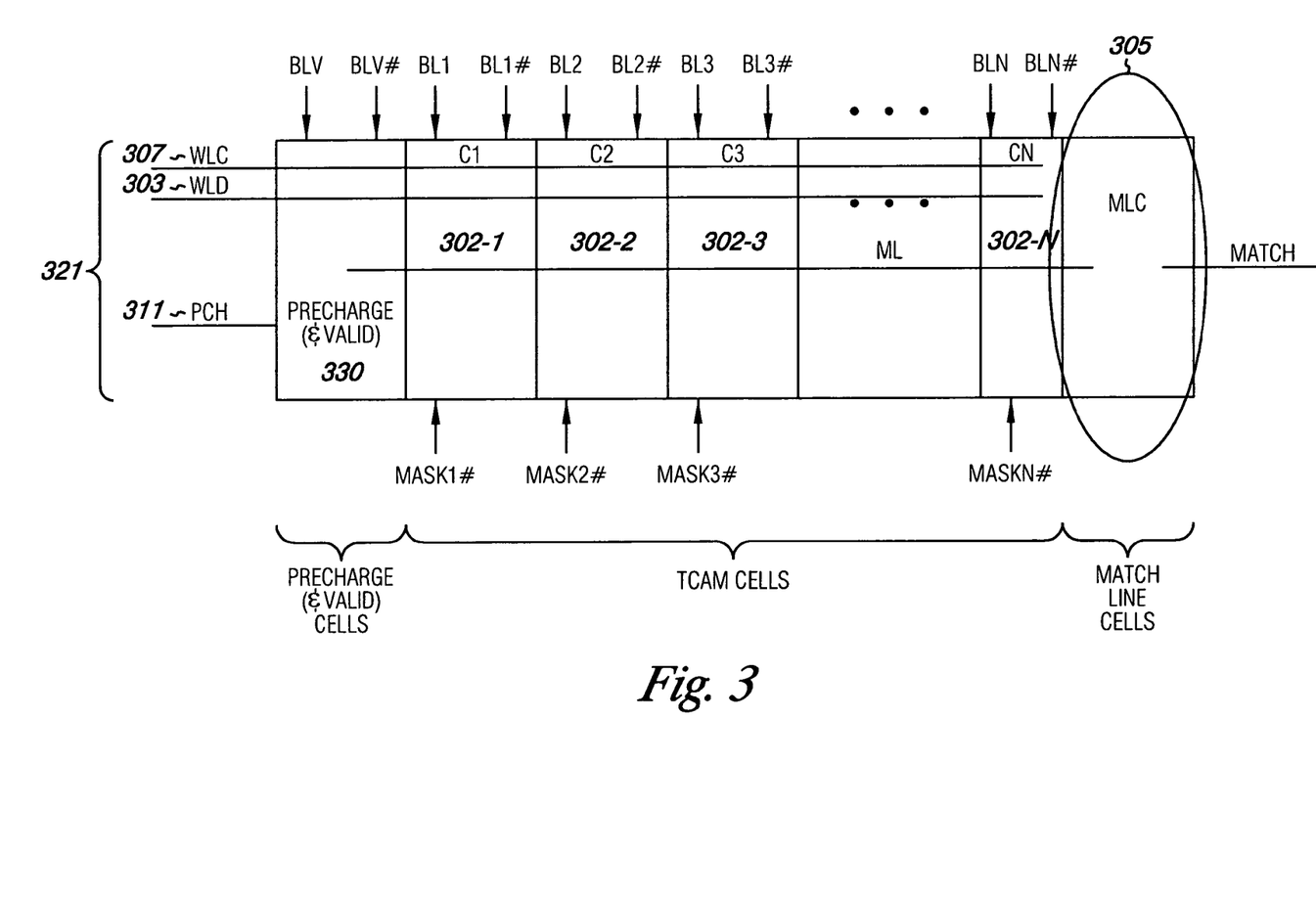
FIG. 3 illustrates a ternary CAM (TCAM) entry, in which embodiments of the present invention can be implemented.

FIG. 3 illustrates TCAM entry 321 according to an embodiment of the present disclosure. The diagram of the features of TCAM entry 321 looks similar to the CAM entry 221 shown in FIG. 2, with the exception that rather than a single word line (WL) for each entry there is a data word line (WLD) 303 and a care word line (WLC) 307 to enable writing to both the "care" and "data" portions of the cells. In addition, rather than a memory array (or simple encoder), a TCAM uses a priority encoder to find and encode the address of the highest priority, e.g., first, match.

As shown in FIG. 3, the TCAM entry 321 includes a number of TCAM cells, e.g., 302-1, 302-2, 302-3, . . . , 302-N, arranged in a row. Each cell, 302-1, 302-2, 302-3, . . . , 302-N, in entry 321 has its own bit line pair, BL1-BL1#, BL2-BL2#, BL3-BL3#, . . . , BLN-BLN#, and its own mask line, MASK1#, MASK2#, MASK3#, . . . , MASKN#, while sharing the same word lines. The TCAM configuration includes word lines for "data" and for "care," e.g., "valid," as described herein and illustrated in FIG. 3 as WLD 303 and WLC 307 respectively. According to various embodiments, the WLD 303 and the WLC 307 word lines allow writing and reading a VALID bit, data entry, and care entries. The cells of a TCAM entry also share the same match line (ML). The VALID signal (not shown in FIG. 3), and the pre-charge signal, e.g., PCH 311, control the pre-charging and discharging of the match line (ML) of a given TCAM entry, e.g., 321, before a compare operation begins. A TCAM array can be formed by additional entries, similar to TCAM entry 321, being arranged into a "stacked" configuration, thereby forming physical or logical columns of aligned cells.

As shown in FIG. 3, each row, e.g., TCAM entry 321, of a TCAM array is associated with pre-charge (and optionally, valid) cells 330, and a MLC 305 having a MATCH output. A TCAM array can be further associated with a RAM array, or priority encoder, which determines and encodes the address of the highest priority matching entry (i.e., if multiple matches occurred they are arranged in order, a most relevant match being selected as having the highest priority), e.g., entry 321, of a TCAM storage system.

Figure 4A:
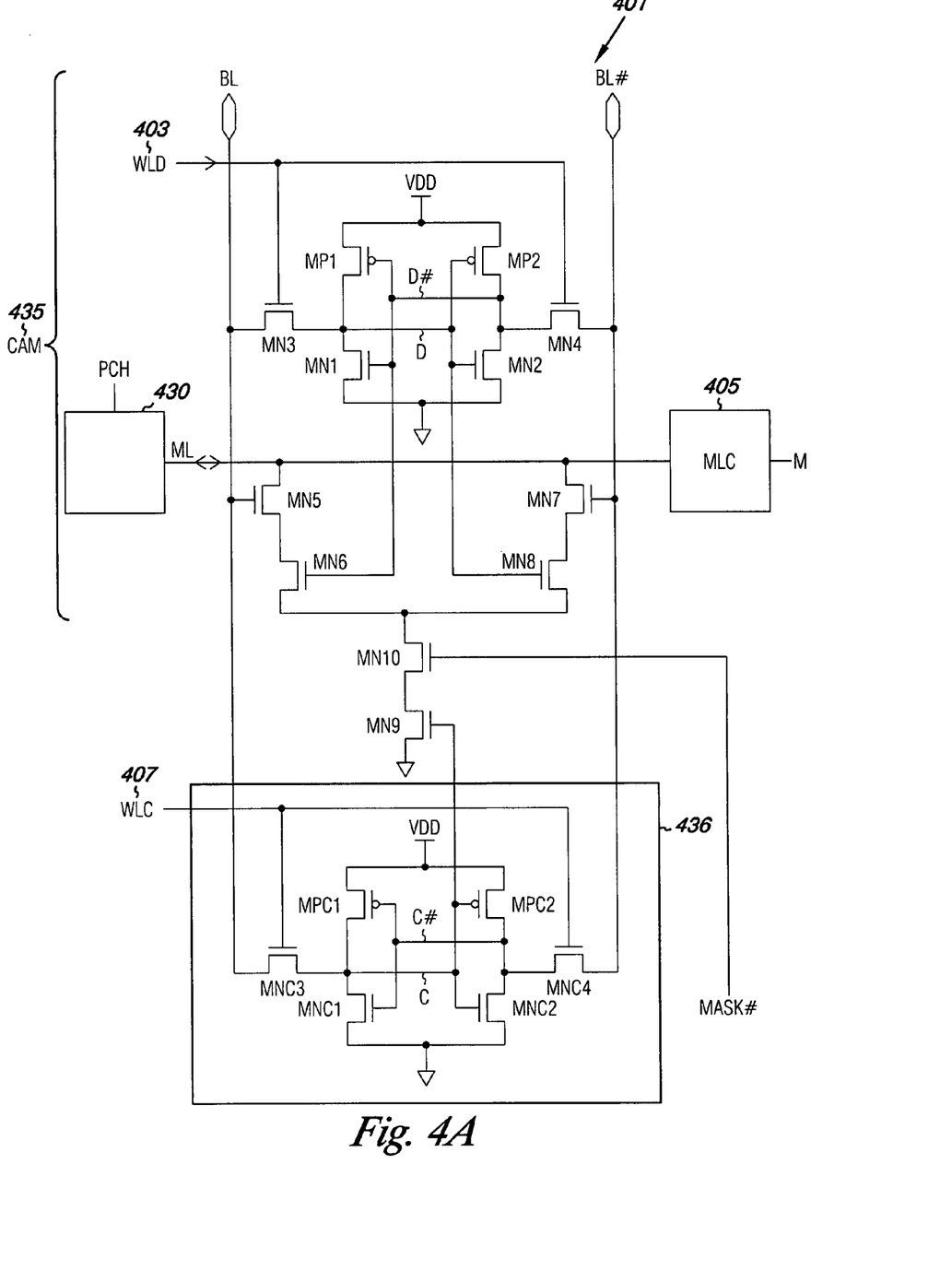
FIG. 4A illustrates a TCAM cell having a single transistor mask control, with which embodiments of the present invention can be implemented.

FIG. 4A shows the circuitry of a TCAM cell 401 able to support three comparison results—miss/match/"don't care." The connections of the top 10 transistors (MP1, MP2, and MN1-MN8) operate similar to a binary CAM cell if the sources of MN6 and MN8 were directly connected to the reference potential, e.g., ground.

First the operation of a binary CAM cell portion will be described by looking at only upper, CAM portion 435, of the circuit 401. Two p-channel transistors (MP1, MP2) and two n-channel transistors (MN1, MN2) are connected as back to back inverters to form a bi-stable memory element with two complementary storage nodes (D, D#). One storage node (D) of the memory element is connected to the drain of an n-channel select transistor (MN3). Two complementary data input lines (BL, BL#), e.g., bit line pairs, provide data inputs/outputs to the CAM cell. The source of MN3 is connected to bit line (BL) for data transfer, and its gate is connected to data word line (WLD) for selecting the memory element. The other complementary storage node (D#) of the memory element is connected to the drain of another n-channel select transistor (MN4). The source of MN4 is connected to the complementary bit line (BL#) for data transfer, while its gate is connected to data word line (WLD) for selecting the memory element.

These upper six (6) transistors (MP1, MP2, MN1, MN2, MN3, and MN4) are arranged in the same manner as a six transistor (6T) static random access memory (SRAM) memory cell. Data can be written into such 6T SRAM cells by putting data on the complementary bit line pair (BL, BL#) while turning on the corresponding data word line (WLD), in the same manner as used in SRAM operations. Similarly to SRAM operations, data can be read from these cells by pre-charging the complementary bit line pair (BL, BL#) while turning on the corresponding data word line (WLD) and using a sense amplifier for detection. The additional 4 transistors (MN5-8) in this ten transistor (10T) CAM portion 435 are used for lookup, i.e., "compare," operations. The gate of n-channel transistor MN5 is connected to BL, and its drain is connected to match line signal ML. In a TCAM arrangement, the ML is pre-charged high and then pulled "low" when there is a "mis-match" (difference in data) in the comparison operation.

The gate of n-channel transistor MN6 is connected to storage node D#, and its source is connected to the drain of an n-channel transistor (MN9). The drain of MN6 is connected to the source of MN5. The gate of n-channel transistor MN7 is connected to BL#, and its drain is connected to signal ML. The gate of n-channel transistor MN8 is connected to storage node D, and its source is connected to the drain of an n-channel transistor MN10, which is arranged in series with n-channel transistor MN9 in a path to a reference potential, e.g., ground. The drain of MN8 is connected to the source of MN7. These 4 transistors (MN5-8) perform an exclusive OR (XOR) logic operation between the complementary storage data (D, D#) and the input data placed on the bit line pair (BL, BL#). They have been referred to herein as the "XOR structure" in the present disclosure. If the storage data (D, D#) and the input data (BL, BL#) have different complementary digital values, either the MN5/MN6 or the MN7/MN8 pairs of the XOR structure will form a conducting path which can pull the voltage on the match line ML toward reference potential, e.g., ground, depending on the state of transistors MN9 and MN 10. The compared result is called a "miss" and/or "mis-matched cell" under this condition. The status of MN9 and MN10 determines whether the match ML is actually discharged to the reference potential, e.g., ground.

If the storage data (D, D#) and the input data (BL, BL#) have the same complementary digital values, both MN5/MN6 and MN7/MN8 pairs remain at high impedance state with no signal current flow from the match line (ML) through this CAM cell. The result obtained under this situation is called a "match." The 10T CAM cell portion 435 in FIG. 4A is therefore capable of performing single bit comparison. A "match" is represented by high impedance state on the match line (ML), while a "miss" is represented by pull down current by the XOR structure of the 10T CAM cell.

By adding the lower eight (8) transistors (MPC1, MPC2, and the six (6) n-channel transistors (MNC1, MNC2, MNC3, MNC4, MN9 and MN10)), a TCAM cell is formed. The sources of MN6 and MN8 are connected to the drain of the n-channel transistor MN10. The source of MN10 is coupled to the drain of MN9, and the source of MN 9 is connected to the reference potential, e.g., ground. The gate of MN10 is connected to a mask line, e.g., MASK#, input. The mask line input is shared by each cell arranged in the same physical or logical column of a TCAM array. A column of cells can be ignored in a compare operation by driving the mask line, e.g., MASK# input, low, thereby placing MN10 in a high-impedance state. The results are the same as when both MN5/MN6 and MN7/MN8 pairs remain at high impedance state, no signal current can flow from the match line (ML) through the CAM cell, thereby indicating a "match" (or more precisely, not indicating a mis-match) regardless of whether a "match" actually occurs between the bits being compared since the match line (ML) is prevented from discharging to the reference potential, e.g., ground. This result is referred to herein as a "don't care" outcome. Therefore, the match output for an entry will depend on the other cells of the entry.

Similarly, the gate of MN9 is connected to a storage node (C) of another memory element 436 providing another "don't care" capability of the TCAM. In the example of FIG. 4A, memory element 436 includes two (2) p-channel transistors (MPC1, MPC2) and four (4) n-channel transistors (MNC1, MNC2, MNC3, MNC4) arranged in the same ways as conventional 6T SRAM memory cell. The "don't care" memory element 436 uses its own "care" word line (WLC) 407, as different from the "data" word line (WLD) 403 described above, while it shares the same bit line pairs (BL, BL#) with the corresponding CAM cell portion 435. When a binary number "1" is written into "care" memory element 436, C is high so that MN9 is conductive. If the cell is not masked (i.e., MASK# is high, thus turning on MN10) when MN9 is conductive, the XOR structure (MN5-MN8) is enabled so that the TCAM cell in FIG. 4A supports the same functions as that of a binary CAM cell. When a binary number "0" is written into memory element 436, C is low so that the XOR structure (MN5-MN8) is always disabled since MN9 is placed in a high impedance state. As such, the comparison result of the CAM portion 435 is always a "match" (or more precisely, cannot be a mis-match since the match line cannot be discharged to the reference potential, e.g., ground). The TCAM cell in FIG. 4A is therefore able to support "care" and "don't care" states, including masked and not masked states. These TCAM cells can be arranged in the same architectures as those described in FIGS. 1 and 3 to form a high density TCAM device, e.g., an array, supporting simultaneous lookup of large numbers of ternary logic data.

Figure 4B:
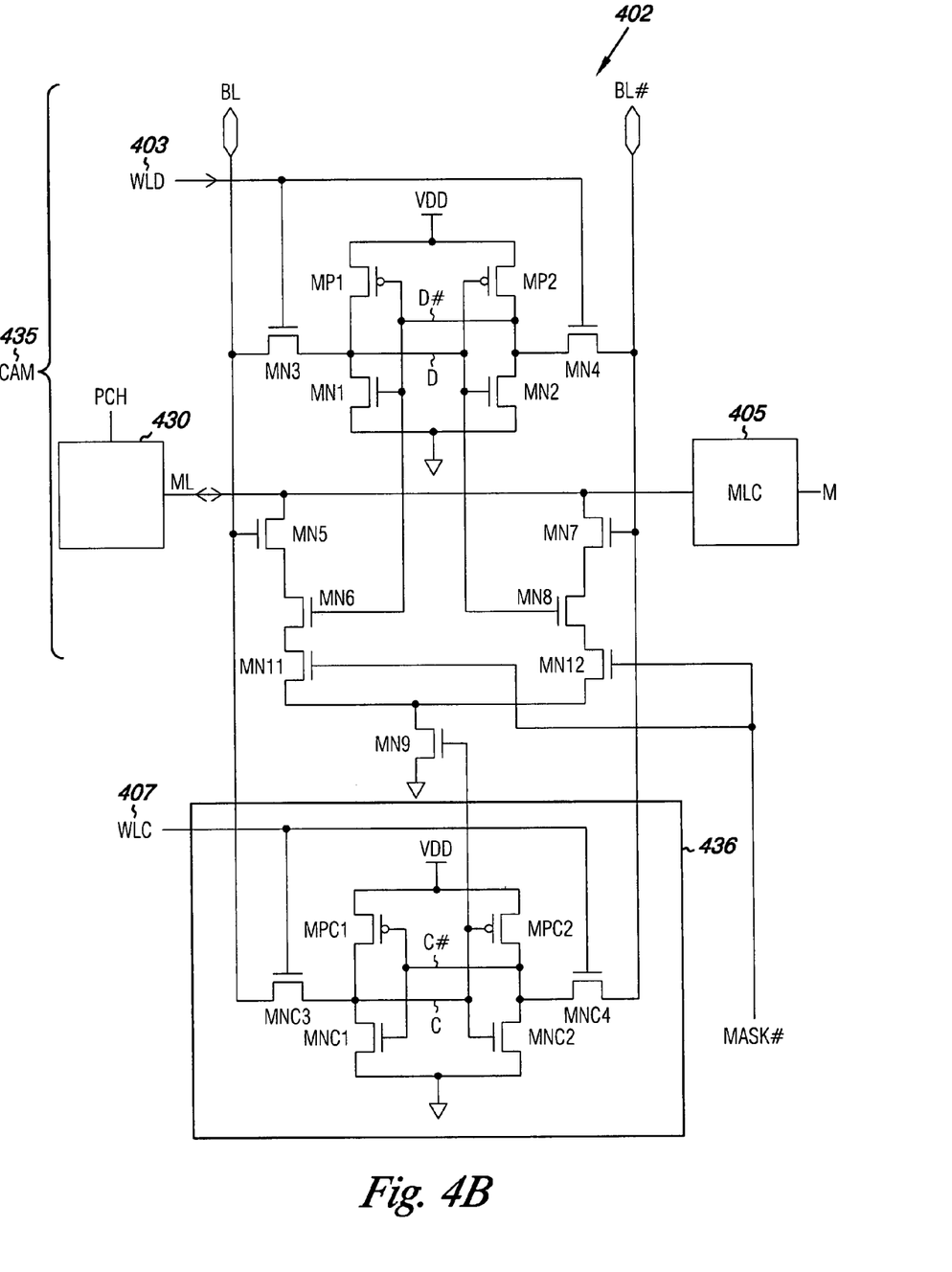
FIG. 4B illustrates a TCAM cell having a dual transistor mask control, with which embodiments of the present invention can be implemented.

FIG. 4B illustrates a TCAM cell circuit 402 having a dual transistor mask control, according to an embodiment of the present invention. The TCAM cell circuit 402 is similar in configuration and operation to that described for TCAM cell circuit 401 shown in FIG. 4A, the difference being the substitution of dual n-channel transistors, MN11 and MN12, in place of the single n-channel transistor MN10 shown in FIG. 4A. The source of MN6 is connected to drain of the n-channel transistor MN11, and the source of MN8 is connected to drain of the n-channel transistor MN12. The sources of MN11 and MN 12 are connected together, and coupled to the drain of MN9. The source of MN9 is connected to the reference potential, e.g., ground. The gates of MN11 and MN12 are both connected to the mask line input, e.g., MASK#. Those having ordinary skill in the art will appreciate that the dual transistor mask control configuration will operate identical to the single mask control transistor configuration. The dual transistor configuration can have some advantages in fabrication of the logic attributable to improved symmetry aspects of the TCAM cell circuit.

Embodiments of the present disclosure are not limited to this example. That is the logic of the n-channel and/or p-channel transistors could be switched to achieve a particular intended functionality and/or architecture. For example, an MLC could pre-charge a match line ML# low and maintain the "active" low state for a "match" and pull the match line (ML) high for a "mis-matched" state. Embodiments are not so limited to the particular logic choice.

Figure 5A:
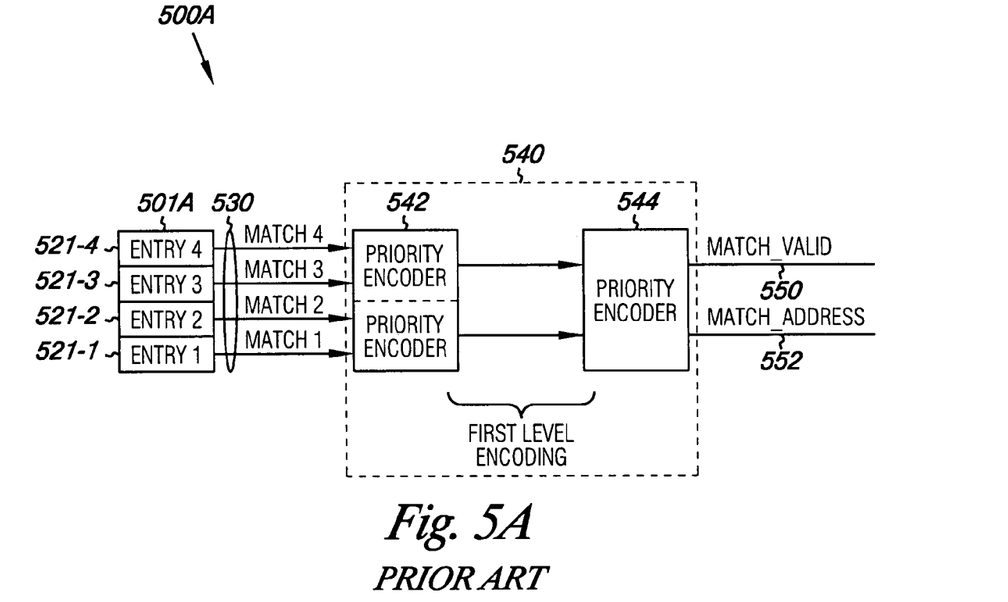
FIG. 5A illustrates a previous TCAM system implementation arranged with one word per entry.

FIG. 5A illustrates a previous TCAM system 500A arranged with one word per entry. As the reader will appreciate, TCAM system 500A includes a TCAM 501A, and a priority encoder 540. TCAM 501 is shown having four (4) entries, e.g., 521-1, 521-2, 521-3, and 521-4, each entry having one (1) word per entry, for a total of four (4) words stored in the TCAM 501A. Having one word per entry connotes search terms being of similar length to the entries, such that the entire entry is involved in the comparison to the search term for a match. Each entry is shown being coupled to a priority encoder 540 by one of a group of match lines 530, e.g., MATCH 1, MATCH 2, MATCH 3, and MATCH 4, corresponding to ENRTY 1, ENTRY 2, ENTRY 3, and ENTRY 4, respectively. Other details of the TCAM are omitted for simplicity of illustration of the present invention. Depending on the quantity of inputs to the priority encoder 540, i.e., outputs from the TCAM 501A, a priority encoder can include multiple stages of priority determination logic as illustrated in FIG. 5A by a first stage priority encoder 542 followed by a second stage priority encoder 544 to produce a MATCH_VALID output signal 550 and a MATCH_ADDRESS output signal 552.

Figure 5B:
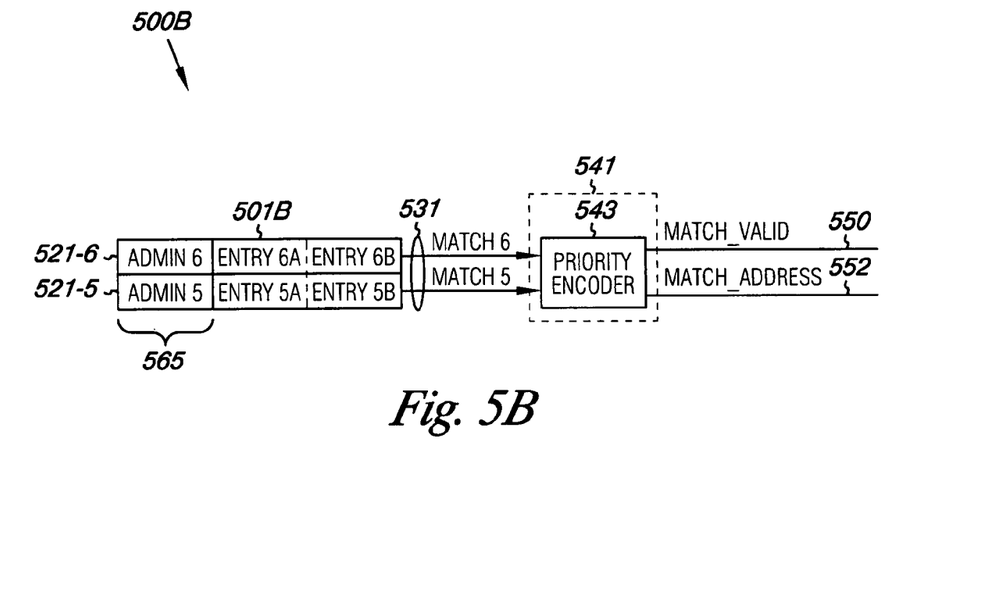
FIG. 5B illustrates a TCAM system implementation arranged with multiple words per entry, according to an embodiment of the present invention.

FIG. 5B illustrates a TCAM system 500B according to an embodiment of the present invention, arranged with more than one word per entry, e.g., shown having two (2) words per entry, e.g., ENTRIES 5A/5B and 6A/6B, in each of two (2) entries, e.g., 521-5 and 521-6, for a total of four (4) data words stored, i.e., not including additional administrative bits 565 per entry. Conversely, each entry has two portions arranged in columns, plus a number of columns of administrative information per entry. TCAM system 500B includes a TCAM 501B, and a priority encoder 541. Each entry is shown being coupled to the priority encoder 541 by one of a group of match lines 531, e.g., MATCH 5 and MATCH 6, corresponding to ENTRY 5A/5B and ENTRY 6A/6B respectively. Administrative bits 565, included in each entry, are used to provide additional information specific to the entry and/or individual word portions of each entry. Other TCAM details are omitted for simplicity of illustration of the embodiment of the present invention.

While the quantity of words contained in TCAM 501B is the same as the quantity of words contained in TCAM 501A, i.e., four (4); however, because the quantity of entries for TCAM 501B are less, by half, than for TCAM 501A, half as many match lines are required. As a result, the priority encoder logic necessary to ascertain priority of match outputs is also reduced, as indicated in FIG. 5B by having only one stage of priority encoding 543 to produce the MATCH_VALID output signal 550 and the MATCH_ADDRESS output signal 552. As the reader will appreciate, by increasing the quantity of words per TCAM entry, the quantity of TCAM entries can be reduced, which allows the complexity, and size, of the support priority encoder logic to be reduced.

To realize the above-mentioned efficiency (having less priority encoder logic associated with a decreased quantity of TCAM entries for a given quantity of words achieved by arranging TCAM entries to contain multiple words), the TCAM is configured to facilitate comparing a search term against the multiple portions of an entry, i.e., multiple individual words of an entry). First, configuration of each entry, and individual compare validity are managed to the word level, i.e., to the sub-entry level, rather than to the entry level. This is accomplished in embodiments of the present invention by use of administrative bits included in each entry, discussed further in conjunction with FIGS. 7A and 7B below. Second, columns of individual words are made selectable, by arranging words in physical or logical columns, and using mask lines to select or de-select particular columns of words (as previously discussed in conjunction with FIGS. 4A and 4B) for simultaneous comparison against a search term having a width less than the width of the TCAM entry, or having the relevant portion of the search term being less than the entire search term.

Figure 6A:
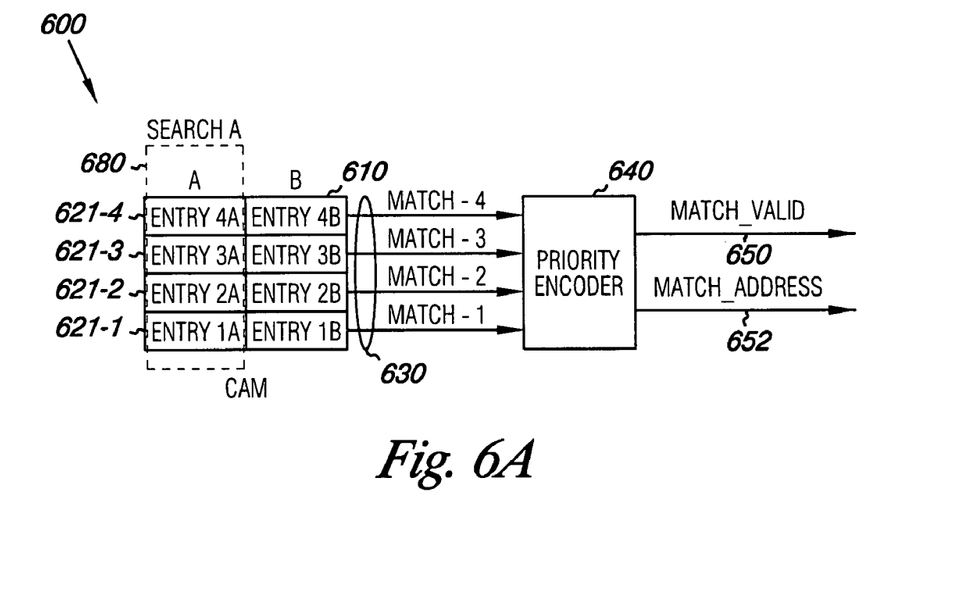
FIG. 6A illustrates a first searchable columnar portion of a TCAM system, according to an embodiment of the present invention.

FIG. 6A illustrates a first searchable columnar portion of a TCAM system 600, according to an embodiment of the present invention. TCAM system 600 is arranged with two words per entry. As the reader will appreciate, TCAM system 600 includes a TCAM 610 coupled by match lines 630 to a priority encoder 640. The internal levels of priority encoding in the priority encoder 640 are omitted from illustration in FIG. 6A. TCAM 610 is shown having four (4) entries, e.g., 621-1, 621-2, 621-3, and 621-4, with two (2) words per entry, for a total of eight (8) words stored in the TCAM. Each entry is divided into an "A" and a "B" word, e.g., ENTRY 1A and 1B, ENTRY 2A and 2B, ENTRY 3A and 3B, and ENTRY 4A and 4B. Each entry is shown being coupled to a priority encoder 640 by one of a group of match lines 630, e.g., MATCH 1, MATCH 2, MATCH 3, and MATCH 4, corresponding to ENTRY 1, ENTRY 2, ENTRY 3, and ENTRY 4 respectively. Outputs of the priority encoder 640 include a MATCH_ADDRESS 652 and a MATCH_VALID 650 to indicate whether or not the MATCH_ADDRESS is valid. Those having ordinary skill in the art will recognize if no match exist, an invalid MATCH_ADDRESS can remain at the output. Other details of the TCAM are omitted for simplicity of illustration of this embodiment of the present invention.

FIG. 6A shows first search, e.g., SEARCH A, including the columnar portion of TCAM 610 containing the first word per entry, e.g., ENTRY 1A, ENTRY 2A, ENTRY 3A, and ENTRY 4A. Ignoring administrative bits for the moment (not shown in TCAM 610), and assuming each entry is N-bits wide, then each of the two (2) words per entry are N/2 bits wide, as is the search term. Before comparing the search term to the SEARCH A portion of each entry of TCAM 610, each of the match lines 630, e.g., MATCH 1, MATCH 2, MATCH 3, and MATCH 4, corresponding to ENTRY 1, ENTRY 2, ENTRY 3, and ENTRY 4, are pre-charged to indicate a match. The SEARCH A portion of each entry of TCAM 610 is "selected" by appropriate application of the mask lines to prevent results of compares in the portion of the TCAM not selected, e.g., not the SEARCH A portion of each entry, from discharging the match line to indicate non-match (as previously discussed with respect to FIGS. 4A and 4B). In this manner, only compares of the search term to the SEARCH A portion of each entry of TCAM 610 are allowed to discharge the respective match line output if a match does not occur. Therefore, the match line output for each respective entry depends only on the compare involving the search term to the SEARCH A portion each entry of TCAM 610.

If the columnar portion of a particular entry matches the search term, and a match is maintained, the corresponding match line for that entry will remain charged to indicate a match as if the entire entry matched in a conventional TCAM. If more than one word in a columnar compare matches the search term, several match lines would indicate matches, and the follow-on priority encoder 640 would be tasked with determining the highest level match for that columnar search using conventional methodologies. In this manner, the MATCH_VALID 650 and MATCH_ADDRESS 652 outputs of the priority encoder would indicate the highest priority match of a search of SEARCH A portion of entries of TCAM 610, if any.

Figure 6B:
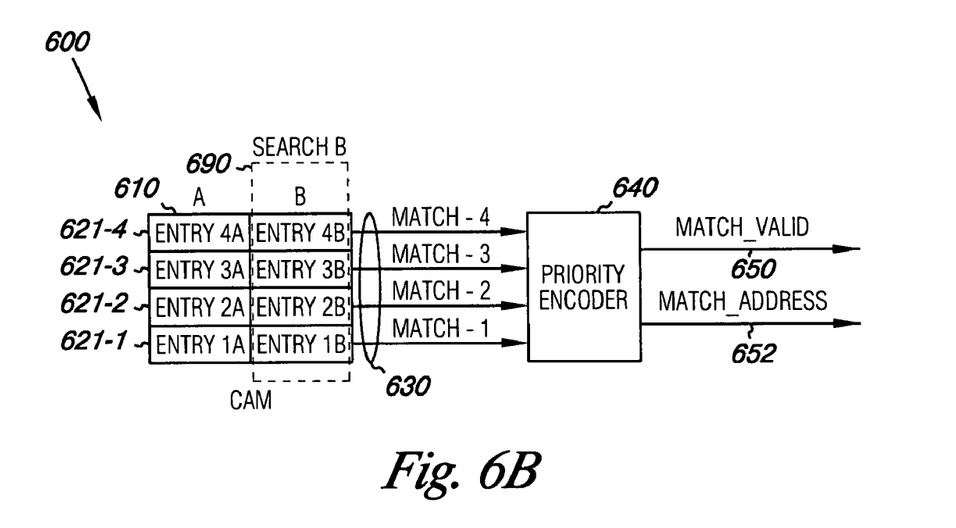
FIG. 6B illustrates a second searchable columnar portion of a TCAM system, according to an embodiment of the present invention.

FIG. 6B illustrates a second searchable columnar portion of a TCAM system, according to an embodiment of the present invention. Subsequently, and similarly, match lines 630 are pre-charged for a new search before a search is made of the SEARCH B portion 390 of each entry of TCAM 610. This time, the SEARCH B portion of each entry of TCAM 610 is "selected" by appropriate application of the mask lines to prevent results of compares in the portion of the TCAM not selected, e.g., not the SEARCH B portion, from discharging the match line to indicate non-match (as previously discussed with respect to FIGS. 4A and 4B). In this manner, only compares of the search term to the SEARCH B portion of each entry of TCAM 610 are allowed this time to discharge the respective match line output if a match does not occur. Therefore, the match line output for each respective entry depends only on the compare involving the search term to the SEARCH B portion of each entry of TCAM 610.

If the columnar portion of a particular entry included in the SEARCH B portion matches the search term, and a match is maintained, the corresponding match line for that entry will remain charged as if the entire entry matched in a conventional TCAM. If more than one word in a columnar compare matches the search term, several match lines would indicate matches, and the follow-on priority encoder 640 would be tasked with determining the highest level match for the SEARCH B columnar search using conventional methodologies. In this manner, the MATCH_VALID 650 and MATCH_ADDRESS 652 outputs of the priority encoder would now indicate the highest priority match of a search of SEARCH B portion of TCAM 610 entries, if any.

Thus, all the words of TCAM 610 are searched using two sequential columnar searches, requiring one search per word within an entry, and resulting in a series of priority encoder outputs, one output for each columnar search. The outputs are pipelined out of the TCAM system 600 on successive compare cycles, e.g., successive clock cycles. As illustrated in FIGS. 6A and 6B, for TCAM 610 having two (2) words per entry; two columnar searches occur in order to completely search the TCAM 610, and two (2) search results are generated by the priority encoder. Additional logic (not shown) can be used to ascertain which, if any, of the two sequential outputs from the priority encoder 640 represent the highest priority output for the entire TCAM 610. In this manner, columnar matches occur over time, which is traded-off for less priority encoder circuit "real estate" and complexity of simultaneous priority encoding a search of all words of a TCAM arranged in one large column, i.e., the TCAM arranged with one (1) word per entry. Applying embodiments of the present invention where time is available to sequentially process columnar searches of a TCAM, embodiments of the present invention offer distinct advantages in support circuit complexity reduction, space minimization, and accompanying cost savings.

Embodiments of the present invention can be expanded to include any number of words per entry. For example, a TCAM entry could be partitioned into four (4) words per entry, the words being arranged in four (4) columns. Thereafter, four (4) columnar searches would search all words of the TCAM, and result in four (4) sequential MATCH_VALID and MATCH_ADDRESS outputs from the priority encoder.

According to one embodiment of the present invention, data words can be stored, or arranged, in the CAM according to a 2-dimensional priority scheme. For example, data words can be stored or arranged where the row positions represent increasing (or decreasing) order of priority, and column positions can also represent increasing (or decreasing) order of priority. In this manner, a 2-dimensional array, i.e., grid, is created within which to organize the priority of data words corresponding to the geographical or logical location within the array arrangement. Subsequently when searching the array by columns, the columns can be selected in priority order, e.g., from lowest to highest, so that the order of the series of columnar matches convey a priority in a first dimension, with the highest priority match per column being determined according to location in a second dimension. A best match result can be selected from the series of columnar match results based on the 2-dimensional priority scheme used to arrange data words in the TCAM since relative position within the array is maintained by the relative position of the match address results (second dimension) and by also pipelining the columnar match results in a known order (along first dimension), e.g., order of selecting columns to be searched from lowest to highest priority.

According to an embodiment of the present invention, an indication of the column participating in the match results is indicated in the match results. Therefore, the beginning of a CAM search can be indicated as corresponding to the first column searched, or corresponding to the next match result after the last column of a CAM search, etc. The column identification can be decoded from a mask pattern and included in an additional field in the columnar match result address, for example. These, and other features, are discussed further in co-pending, co-assigned U.S. patent application Ser. No. 11/810,072, entitled, "Content Addressable Memory Address Resolver", filed Jun. 4, 2007, and having common inventorship. The same is incorporated herein in full by reference.

In order to manage sub-entry level searches, i.e., word level searches, of a TCAM, additional administrative information is required. According to embodiments of the present invention, a TCAM is configured such that entries include this additional administrative information. Conventional TCAM entries typically include line_valid information, i.e., a bit or bits per entry, to indicate whether a particular entry is valid. According to embodiments of the present invention, the line_valid information for a TCAM configured to enable searching multiple words per entry, indicates whether any word within a particular entry is valid. Conversely, the line_valid information is most useful because it also indicates when all of the words within a particular entry are invalid; therefore, the line valid can be used in columnar search techniques in a similar manner to the way line_valid information is used in a conventional TCAM to force a compare into a non-matching state.

However, if at least one of the individual words of an entry is valid causing the line_valid information to indicate this status, additional information is necessary to indicate which of the multiple words of an entry are valid, and which are not. According to one embodiment of the present invention, a bit per word is added to each entry, e.g., as part of the administrative bits shown in FIG. 5B, to indicate the validity of a corresponding word. This word_valid bit is used in compare logic during a respective columnar compare operation. Alternatively, the word_valid information may be processed in the same fashion that the line_valid bit is used in a conventional compare operation, i.e., when a TCAM is configured to have only one word per entry. According to another embodiment of the present invention, the word_valid and line_valid bits may be OR'd together and used in a columnar compare operation, i.e., requiring both the line and word being compared to be valid.

In addition to the word_valid information, word size or entry partition information is desirable where the number of words per entry is variable or not assumed. For example, in a conventional TCAM arrangement, it is assumed that the TCAM is configured to include one (1) word per entry. According to one embodiment of the present invention, each entry includes some fixed quantity of words per entry, and thus the compare logic and priority determination logic is configured to operate with this fixed quantity of multiple words per entry. According to another embodiment of the present invention, the quantity of words per entry that an entry may be "partitioned" into and searched-by is variable and can be set from 1 to N, N being the width of an entry (excluding administrative bits). In this embodiment, word size information is included in each entry to encode the number of words included in that entry. For example, assuming an entry width of 128 bits (excluding administrative bits), then an entry can be logically partitioned into one 128-bit word, or two 64-bit words, or four 32-bit words, or eight 16-bit words, etc. Therefore, word size (or entry partition) information is added to encode the number of possible words (or partitions) it is desired to be able to configure an entry. In the example above, four different entry configurations are described and two bits of information could be used to denote which configuration is being used for a given entry.

The line_valid, word_valid and word_size information are collectively referred to herein as the "administrative bits" of an entry. Administrative bits can include some or all of this information, or additional entry-level, word-level, or search-level information as may be necessary to manage the sub-entry level search process efficiently. Administrative bits of a TCAM entry can be grouped together, or dispersed across the TCAM entry with a geographic association between data words and corresponding administrative information.

Figure 7A:
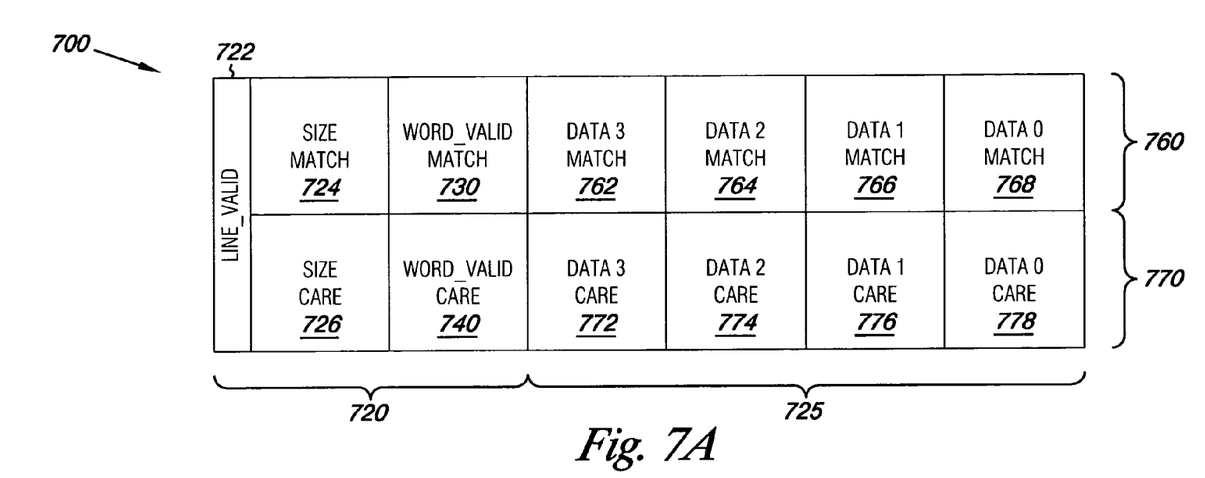
FIG. 7A illustrates a TCAM entry, arranged with grouped word_valid bits, according to an embodiment of the present invention.

FIG. 7A illustrates a TCAM entry 700, arranged with grouped word_valid bits, according to an embodiment of the present invention. TCAM entry 700 includes an administrative portion 720 and a data portion 725. The data portion 725 is illustrated in FIG. 7A as including 4 words, e.g., DATA 0, DATA 1, DATA 2, and DATA 3, each consisting of a match portion 760 (e.g., DATA 3 MATCH 762, DATA 2 MATCH 764, DATA 1 MATCH 766, and DATA 0 MATCH 768), and a care portion 770 (e.g., DATA 3 CARE 772, DATA 2 CARE 774, DATA 1 CARE 776, and DATA 0 CARE 778).

The administrative portion 720 includes line_valid information 722. While conventional line_valid information is used to indicate whether or not the entire entry is valid, i.e., the one word per entry is valid, the line_valid information 722 of the embodiment of the present invention shown in FIG. 7A indicates whether any of the words within the entry are valid, i.e., one or more of the words of the entry are valid.

The administrative portion 720 also includes information concerning the size of the words contained in an entry, as indicated by the size match bits 724 and the size care bits 726. For example, if a TCAM entry is configured to include 128 data bits (in addition to administrative bits), the 128 data bits might represent one (1) 128-bit word, or two (2) 64-bit words, or four (4) 32-bit words, etc. The particular division of the entry into words is encoded into the size information, e.g., size match 724 and size care 726.

In addition to the line_valid information 722, the administrative portion 720 includes word_valid information to individually indicate the validity of each word of the entry. If all words within a particular entry were valid, their uniform validity could be indicated by the line_valid information 722. However, for the condition in which one or more words of an entry are valid and one or more words of that same entry are not valid, word validity information is included in the entry. This word_valid information for each respective word is shown in FIG. 7A being grouped together, and including word_valid match bits 730 and word_valid care bits 740. The data portion 725 illustrated in FIG. 7A includes four words, e.g., DATA 0, DATA 1, DATA 2, and DATA 3. One method according to the present invention to convey individual word validity is to associate one bit per word of word_valid information to each of the 4 words. Therefore, in the example illustrated in FIG. 7A, word_valid match 730 and care 740 includes 4 bits, one corresponding to the validity of each data word respectively.

Figure 7B:
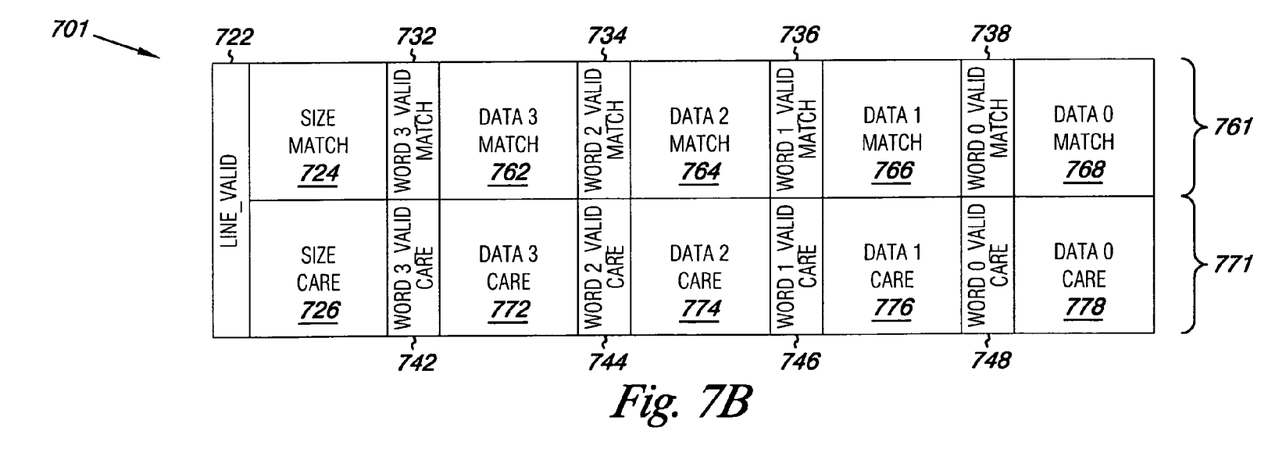
FIG. 7B illustrates a TCAM entry, arranged with dispersed word_valid bits, according to an embodiment of the present invention.

FIG. 7B illustrates a TCAM entry 701, arranged with dispersed word_valid bits, according to another embodiment of the present invention. TCAM entry 701 is configured similar to TCAM entry 700, but rather than have the word_valid information, e.g., word_valid match 730 and word_valid care 740 of FIG. 7A, grouped together, the respective word validity information for each respective word is dispersed throughout the entry 701 in proximity to the data word information to which it is associated.

Other TCAM entry bit arrangement configurations to provide the necessary information to facilitate compares based on some portion of each entry are contemplated by the present invention. Of course particular arrangement and configuration of each entry must be compatible with the software or hardware logic implementation of the compare operation.

As noted above, the reader will appreciate that various embodiments described herein can be performed by application specific integrated circuit (ASIC) logic (e.g., hardware in the form of transistor gates, etc.) shown herein or otherwise. Unless explicitly stated, the methods of the various embodiments described herein are not constrained to a particular order or sequence. Additionally, some of the described methods of the various embodiments can occur or be performed at the same point in time.

Software, e.g., computer executable instructions, can be used to arrange words into entries, or select columnar portions of a CAM based on arrangement of words in an entry, or entries in a CAM to achieve searching efficiencies. There may be a tradeoff between the size of the words and the number of words in each entry. The greater the quantity of words in each entry, the more compare cycles, i.e., time, required to columnar search the entire CAM. Increasing the quantity of compare cycles needed to completely search a CAM not only increases latency in obtaining CAM search results, but also an increased CAM utilization time per search effectively reduces CAM bandwidth. However, less parallel priority encoding capability is required for a CAM having a smaller quantity of entries (but more words in each entry) than is needed to implement parallel prioritizing logic for a CAM having a larger number of entries. So too, the overhead of additional administrative bit(s) increase as the number of words per entry increase, contributing to additional CAM storage requirements. Balancing the efficiencies of sequential columnar searching of a CAM against the above-mentioned considerations are done on an application specific basis.

Figure 8:
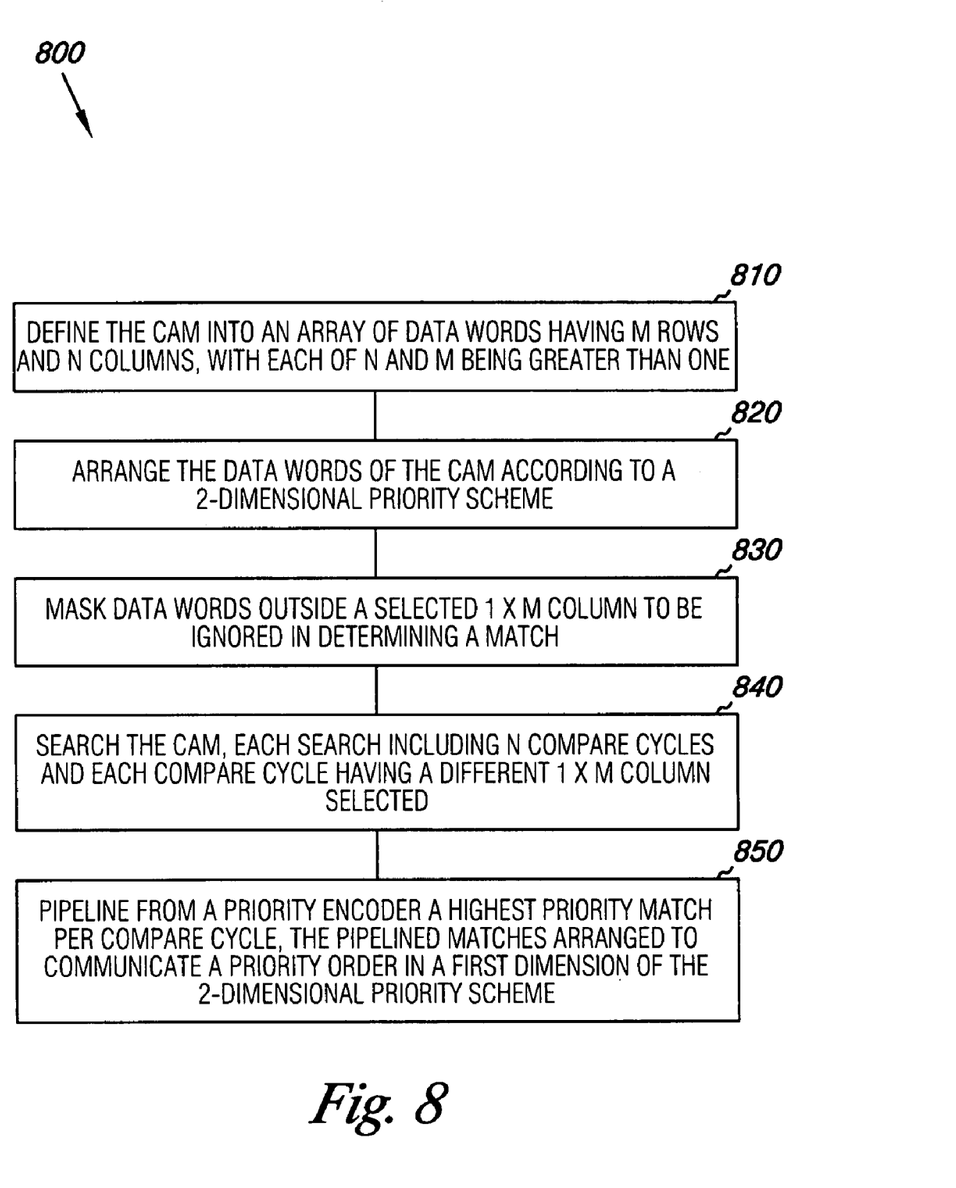
FIG. 8 illustrates a method embodiment for a CAM, according to an embodiment of the present invention.

FIG. 8 illustrates a method which may be used in association with a content addressable memory (CAM). The method includes defining a CAM into an array of data words having M rows and N columns, with each of N and M being greater than one, as shown at block 810. Block 820 illustrates arranging the data words of the CAM according to a 2-dimensional priority scheme. Block 830 illustrates masking data words outside a selected 1×M column to be ignored in determining a match. The CAM is searched, each search including N compare cycles and each compare cycle having a different 1×M column selected, as shown at block 840. Block 850 shows a highest priority match per compare cycle being pipelined from a priority encoder with the pipelined matches arranged to communicate a priority order in a first dimension of the 2-dimensional priority scheme.

The method described in connection with FIG. 8 can be present in whole or in part in embodiments of other Figures, e.g., in the pre-charge (and valid) cells of FIGS. 1-4, within TCAM 501B of FIG. 5B, and within the TCAM 610 of FIGS. 6A and 6B. Embodiments, however, are not limited to the example given herein.

It is to be understood that the above description has been made in an illustrative fashion, and not a restrictive one. Although specific embodiments have been illustrated and described herein, those of ordinary skill in the art will appreciate that other component arrangements and device logic can be substituted for the specific embodiments shown. The claims are intended to cover such adaptations or variations of embodiments of the present invention, except to the extent limited by the prior art.

In the foregoing Detailed Description, various features are grouped together in a single embodiment for the purpose of streamlining the disclosure. This method of disclosure is not to be interpreted as reflecting an intention that any claim requires more features than are expressly recited in the claim. Rather, as the following claims reflect, inventive subject matter lies in less than all features of a single disclosed embodiment. Thus, the following claims are hereby incorporated into the Detailed Description, with each claim standing on its own as a separate embodiment of the invention.

What is claimed:

1. A method for using a content addressable memory (CAM), comprising:

defining the CAM into an array of data words having M rows and N columns, with each of N and M being greater than one;

arranging the data words of the CAM according to a 2-dimensional priority scheme;

masking data words outside a selected 1×M column to be ignored in determining a match;

searching the CAM, each search including N compare cycles and each compare cycle having a different 1×M column selected; and pipelining from a priority encoder a highest priority match per compare cycle, the pipelined matches arranged to communicate a priority order in a first dimension of the 2-dimensional priority scheme, wherein a word validity indication corresponding to the data word of the selected column is not masked so as to participate in the compare cycle for the selected column to determine the highest priority match for the compare cycle for the selected column.

2. The method recited in claim 1, wherein the N columns of data words are arranged in priority order along the first dimension and the M rows of data words are arranged on priority order along the second dimension.

3. The method recited in claim 1, wherein the different 1×M columns are sequentially selected in priority order, the lowest priority column being selected for the first compare cycle and the highest priority column being selected for the $N^{th}$ compare cycle.

4. The method recited in claim 1, wherein an indication of the selected column is communicated along with an associated highest priority match per compare cycle.

5. The method recited in claim 4, wherein the method includes identifying the highest priority match of a first compare cycle for each search.

6. The method recited in claim 1, wherein word validity indications corresponding to the data words outside the selected 1×M column are masked so as to prevent participation in compare operations to determine the highest priority match per compare cycle.

7. The method recited in claim 1, wherein each CAM row includes N data word valid bits.

8. The method recited in claim 7, wherein each CAM row includes 1 row valid bit.

9. The method recited in claim 1, wherein size of each data word in each row is encoded in each CAM row.

10. A method for using a ternary content addressable memory (TCAM) system, comprising:
dividing each TCAM entry to include multiple data words per entry, the data words arranged in columns;
arranging the data words in the TCAM according to a priority scheme;
searching the TCAM one column at a time, to produce a series of highest priority column matches to a search term, one highest priority column match associated with each column; and
selecting a best match result from among the series of highest priority column matches according to the priority scheme,
wherein each data word includes an indication of validity of that data word, the indication being included in the compare of the data word to the search term.

11. The method recited in claim 10, wherein the TCAM is arranged to have M rows of entries, each entry being divided into N data words, such that the TCAM has N times M total data words compared when searching the TCAM, with N column match results being pipelined after all data words are compared to a search term, one word per entry per columnar search operation.

12. The method recited in claim 10, wherein TCAM columns are sequentially searched across an entry, and corresponding highest priority column matches being pipelined out on consecutive compare cycles.

13. A ternary content addressable memory (TCAM) system, comprising:
a TCAM including a number of TCAM cells arranged in rows and columns; and
a priority encoder coupled to the TCAM;
wherein the TCAM includes logic to:
define the TCAM into an array of data words having M rows and N columns, with each of N and M being greater than one;
arrange the data words of the TCAM according to a 2-dimensional priority scheme;
mask data words outside a selected 1×M column to be ignored in determining a match;
search the TCAM, each search including N compare cycles and each compare cycle having a different 1×M column selected; and
enable a word validity indication corresponding to the data word of the selected column so as to participate in the compare cycle for the selected column to determine a highest priority match per compare cycle in the compare cycle for the selected column;
and wherein the priority encoder includes logic to pipeline the highest priority match per compare cycle arranged in a series to communicate a priority order in a first dimension of the 2-dimensional priority scheme.

14. The TCAM system of claim 13, wherein the TCAM includes logic to:
pre-charge each TCAM row match output to indicate a match, and prevent masked columns from discharging match outputs regardless of compare results for that portion of each row.

15. The TCAM system of claim 13, wherein the TCAM includes logic to communicate an indication of the selected column along with an associated highest priority match per compare cycle.

16. The TCAM system of claim 13, wherein the TCAM includes logic to enable a row validity indication so as to participate in compare operations to determine the highest priority match per compare cycle.

17. The TCAM system of claim 13, wherein the TCAM includes logic to sequentially select the different 1×M columns in priority order, the lowest priority column being selected for the first compare cycle and the highest priority column being selected for the Nth compare cycle.

* * * * *